United States Patent [19]
Gambill et al.

[11] Patent Number: 5,250,893
[45] Date of Patent: Oct. 5, 1993

[54] DIGITAL VOLTMETER

[75] Inventors: Terry A. Gambill, N. Perry; Roger B. Fell, Madison, both of Ohio

[73] Assignee: Tegam, Inc., Madison, Ohio

[21] Appl. No.: 830,227

[22] Filed: Jan. 31, 1992

[51] Int. Cl.⁵ ............................................. G01R 15/08
[52] U.S. Cl. ................................... 324/115; 324/99 D
[58] Field of Search ................... 324/115, 116, 103 R, 324/99 D, 130; 340/657, 660; 364/483, 481; 341/155

[56] References Cited

U.S. PATENT DOCUMENTS

| | | | |
|---|---|---|---|
| 3,536,998 | 10/1970 | Nordholm | 324/115 |
| 3,723,843 | 3/1975 | Duckworth | 321/1.5 |
| 4,034,291 | 7/1977 | Allen et al. | 324/121 R |
| 4,127,810 | 11/1978 | Purland | 324/99 D |
| 4,520,310 | 5/1985 | Kelly et al. | 324/115 |
| 4,612,617 | 9/1986 | Laplace, Jr. et al. | 364/483 |
| 4,663,586 | 5/1987 | Swerlein et al. | 324/115 |
| 4,864,226 | 9/1989 | Tachimoto et al. | 324/115 |
| 4,908,569 | 3/1990 | Fest | 324/120 |
| 4,933,631 | 6/1990 | Eccleston | 324/115 |
| 5,119,019 | 6/1992 | George | 364/483 |
| 5,142,221 | 8/1992 | Meldrum et al. | 324/130 |

Primary Examiner—Vinh Nguyen
Attorney, Agent, or Firm—Oldham, Oldham & Wilson Co.

[57] ABSTRACT

A voltage measuring instrument which generally includes signal conditioning circuitry coupled to input probes for protection against overvoltages and processing of input voltage signals. A VAC/VDC control circuit will determine whether AC or DC voltages are present, and will positively indicate when no voltage is present in a test circuit. The metering circuit of the invention will thereby automatically determine the proper mode of operation for the type of voltage present in a test circuit so as to eliminate user selection of operating parameters and possible errors. Further, the metering circuit is adapted to generate a proper reference voltage for the measured voltage automatically, to again eliminate selection of a voltage range by the user. A power supervision circuit is adapted to automatically shut off the measuring instrument after a predetermined amount of time has elapsed, and will automatically shut off power in the event that available battery power drops below a given level. There may be additionally provided a true RMS measuring circuit and a continuity measuring circuit which may be automatically implemented. The voltmeter provides an instrument which is substantially insensitive to effects of distributive capacitance within a test circuit, and provides a safe, easy to operate and versatile measuring instrument.

19 Claims, 6 Drawing Sheets

DIGITAL VOLTMETER

BACKGROUND OF THE INVENTION

This invention generally relates to voltage measurement devices, and more particularly to digital voltmeters capable of measuring AC and DC voltages with automatic selection of the proper measurement function so as to provide a safe measuring instrument. The digital voltmeter of the invention may also provide a measuring instrument which is substantially insensitive to the effects of distributed capacitance, for accurate and reliable voltage measurement.

Many situations, from checking and testing of electrical service installations to checking the integrity of residential wiring, require the use of voltage measuring equipment capable of measuring the magnitude of an AC line voltage, DC voltage or combination thereof. It should be evident that in the verification of electrical service voltage, very high voltages may be encountered, making routine power measurement a possibly dangerous activity. For providing such measurement capabilities, there have been developed a number of AC/DC voltage reading voltmeters or multi-function meters adapted to measure voltage in conjunction with other electrical parameters.

In this respect, various AC and DC analog voltmeters have been developed which operate with a galvanometer type meters to indicate the magnitude of the voltage being measured. Many of these analog type instruments are deficient in that they have low input impedance and therefore require a substantial amount of electrical current to deflect the meter, which will distort the voltage measurement in many cases. Digital voltmeters have also been developed which may avoid the inaccuracy of some analog meters, but in turn have other recognized deficiencies.

Both analog and digital voltmeters are subject to inaccuracy, are bulky, fragile and the use thereof is possibly dangerous. Many such meters include range and function selection switches which are manipulated by the user. The voltmeter must be capable of measuring voltages over a wide range of magnitudes, which will require the user to have knowledge of what voltages are to be expected. If the wrong function or range is selected on a voltmeter, there is the possibility that an over-voltage could cause the measuring instrument to explode upon application to a voltage source. Additional problems can be encountered when an electrician or other user attempts to use an AC voltmeter to clear a DC line under a misconception of whether a particular line carries AC or DC line voltage, or a DC voltage with an AC ripple.

In other situations, such as checking the integrity of residential wiring, the measurement of the voltage between the line and load connections of a meter-base with the residential switch in the open position is performed. In these and other situations, distributed capacitance present on the line may inhibit accurate measurements with a voltmeter. Most digital voltmeters as well as a few analog voltmeters cannot be used where significant capacitive effects are present. A "parasitic" current flows through the meter which returns to ground via the distributed free-space and interconductor capacitance of the load wiring. Although sensitive voltmeters are able to measure this "parasitic" current, the presence of this current will result in ambiguous readings as to the condition of the load wiring. A low impedance voltmeter may avoid the effects of distributed capacitance to some degree, but have the deficiencies as mentioned previously with respect to accuracy of voltage measurements.

In yet other situations, electrical continuity measurements are desired to be made with a voltmeter, but such measurements may compromise the voltage measurement capabilities of the meter. For example, continuity measurements may be made with a solenoid type meter, but accuracy of the voltage measurements is compromised. The prior art voltage measuring equipment has generally been found to not be as reliable or as safe as desired, and has lacked the flexibility to perform variable measurement operations in an easy and accurate manner.

SUMMARY OF THE INVENTION

Based upon the foregoing, there has been found a need to provide a voltage measuring apparatus which overcomes the deficiencies of the prior art and provides a safe and easy to use meter for measuring the magnitudes of voltages in a variety of applications. It is therefore a main object of the invention to provide a voltage measuring instrument which automatically selects AC or DC operation to eliminate the possibility of user selection errors, to make use of the voltmeter safe and convenient.

It is another object of the invention to provide a voltage measuring instrument which will automatically measure either AC or DC voltages, and display the magnitude of the voltage measured, the current type and polarity of the signal being tested.

Another object of the invention is to provide a voltage measuring instrument which is substantially insensitive to the effects of distributive capacitance in a line being tested.

Still another object of the invention is to provide a voltage measuring apparatus which allows continuity measurements to be automatically made without sacrificing the voltage measurement capabilities of the apparatus.

Another object of the invention is to provide a voltage measuring instrument which includes a variety of safety features designed to eliminate possible shock or explosion due to voltage transients or overvoltages for example.

To accomplish these objects as well as others, the voltage measuring instrument of the invention generally comprises signal conditioning circuitry coupled to input probes, which may themselves include integral fuses for added protection against over voltages. The signal conditioning circuitry includes an amplification stage adapted to filter and attenuate signals introduced through the input probes. These signals are then connected to circuitry designed to test for both AC and DC voltages so as to positively indicate when no voltage is present in a test circuit. This circuit will also determine if both AC and DC voltages are present, and will display the largest voltage present upon a comparison of the DC magnitude against peak AC voltage so as to identify and display the strongest voltage present in the tested circuit. The circuitry for alternating operation of the voltage measuring device between AC and DC modes includes logic circuitry adapted to monitor the input signal to determine whether there is a transition through zero volts in a repeated fashion indicating an AC component. Logic circuitry is also provided for an appropriate indication of whether an AC or DC voltage has been measured, the status of the battery power as well as other operational characteristics of the voltmeter. A power supervision circuit is used to automatically turn off the voltmeter after a predetermined amount of time or if battery power falls below a predetermined level which would compromise the integrity of voltage measurements taken with the instrument.

Alternatively, the voltage measuring apparatus may include signal conditioning circuitry which allows the voltmeter to simulate a low impedance type meter while maintaining overvoltage protection to prevent the possibility of explosion, vibration or meltdown of the circuitry during routine power measurements. The ability to simulate a low impedance voltage measuring device enables the effects of distributive capacitance to be minimized while not significantly impacting on the accuracy of voltage readings taken with the instrument. In this embodiment, a shunting impedance is positioned across the input terminals of the voltage measuring apparatus so as to divert most parasitic current resulting from distributive capacitance. In such a case, over voltage protection is provided by other circuit components in a desired manner.

Additionally, a continuity measuring circuit may be provided, to yield an indication of whether continuity exists in a tested circuit. The input voltage is directed to a window comparator, wherein the continuity function will be activated if the measured voltage lies between a predetermined low voltage range. The continuity function and circuit is adapted to introduce a current into the test circuit to determine if there is a voltage drop which occurs in the test circuit indicating a condition of no continuity. Such a continuity measurement may be performed as a distinct procedure from voltage measurement and may be automatically performed if the measured voltage lies within a predetermined low voltage range.

As yet another alternative, the voltage measuring apparatus may be provided with a true RMS measuring circuit to measure the root means square (RMS) value of a complex AC voltage waveform. As part of the signal conditioning circuitry, AC signals will be converted to a true RMS signal suitable for digital display. The signal processing circuitry will process AC input signals so as to convert the true RMS value of the complex AC waveform to a DC value which may then be processed to yield the RMS value of the waveform. True RMS measurement using the voltage measuring apparatus allows compensation for harmonic distortions which may occur when nonlinear loads form a portion of the test circuit. The voltage measuring apparatus of the invention is safe and easy to use while being accurate and providing a variety of measuring capabilities.

BRIEF DESCRIPTION OF THE DRAWINGS

The objects and advantages of the voltage measuring apparatus will become apparent upon a further reading of the detailed description of preferred embodiments, in conjunction with the drawings, wherein.

DETAILED DESCRIPTION OF THE INVENTION

Figure 1:
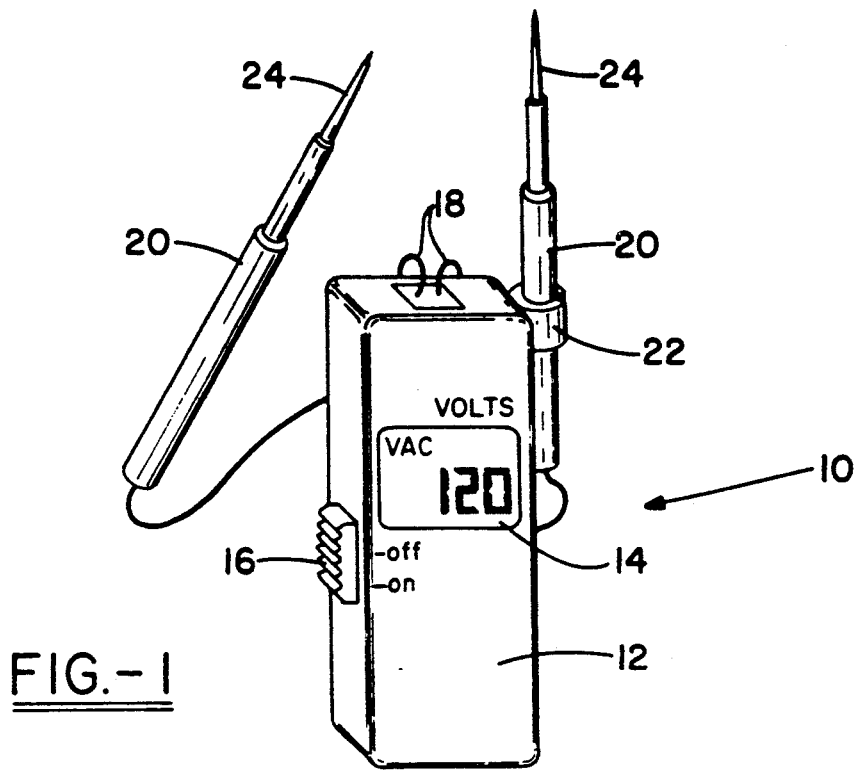
FIG. 1 is a perspective view of the voltage measuring instrument of the invention.

Turning now to FIG. 1, the voltage measuring apparatus 10 of the invention is shown to be a hand-held instrument including a housing 12 with a display 14 and an on/off switch 16 thereon. Test leads 18 are coupled with the internal circuitry of the voltmeter, and positive and ground probes 20 are provided for easy access to a test circuit. The housing 12 may include a probe holder 22 to permit two hand operation, and the test leads 18 are preferably permanently secured within the case 12 in a strain-relieved assembly. The permanently secured test leads facilitate preventing shock and electrical flashes caused by banana plug connectors associated with the probes of a voltmeter. Additionally, the probe tips may be shielded by spring-loaded retracting sleeves to insure safe operation of the apparatus. As will be hereinafter described, the probes may also be provided with integral fuses to protect the measuring circuit of the instrument and facilitate safe use of the voltmeter. Additionally, the probes could also include integral high voltage resistors which will prevent electrical overload or abuse of the voltmeter due to voltage transients.

Figure 2:
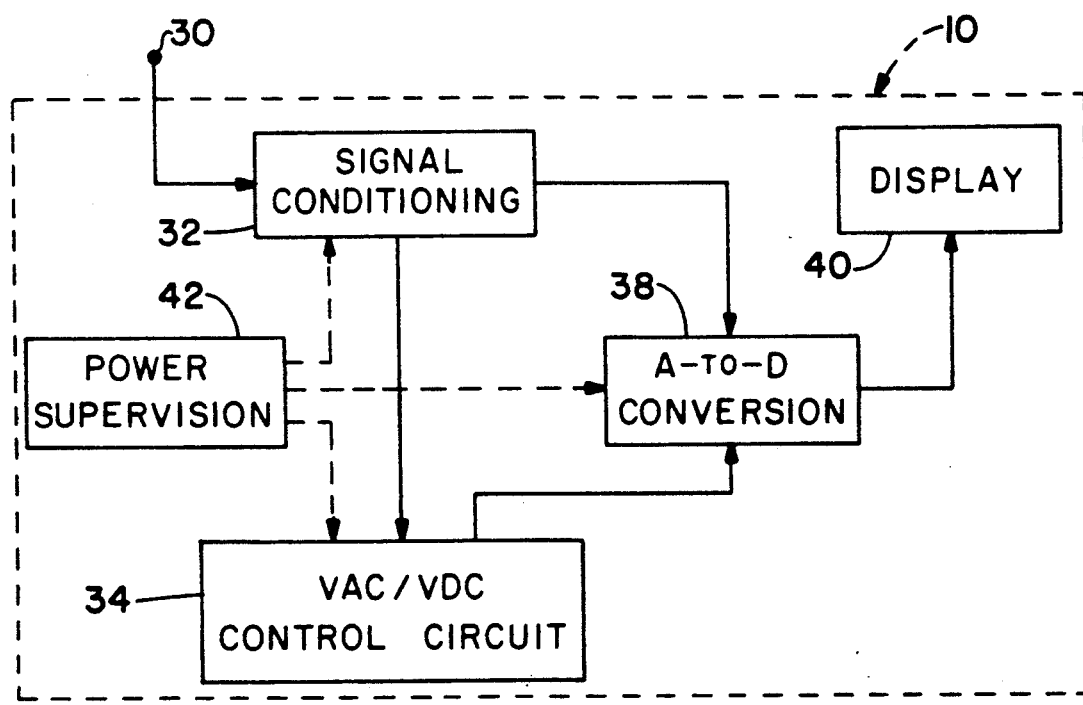
FIG. 2 is a block diagram of a first embodiment of the voltage measuring instrument in accordance with the present invention.

The function of the voltage measuring apparatus is broadly illustrated in the block diagram of FIG. 2, wherein an input voltage will be connected through terminal 30 to a signal conditioning circuit 32. The signal conditioning circuit 32 provides additional protection against accidental overloads and filters and attenuates the input signal while performing processing thereof. The output of the signal conditioning circuit 32 is coupled to an VAC/VDC control circuit 34 designed to test the input signal to determine whether the signal is an AC or DC signal or a combination thereof. The control circuit 34 will automatically select the proper type of voltage signal to accurately measure the magnitude thereof. When both AC and DC input voltages are present, the VAC function is automatically selected if peak AC voltage is greater than the magnitude of DC voltage present. If the peak AC voltage is less than the magnitude of DC voltage, the VDC function will be automatically selected, such that the user will always be provided with an indication of the highest voltage present on the test circuit. Once the determination of whether an AC or DC input voltage has been made, a proper reference voltage will be automatically selected for the current-type of voltage being measured. The automatic selection of AC or DC operation prevents the possibility of operator error. An analog to digital converter 38 receives the input signal from signal conditioning circuit 32 and the output of the control circuit 34, and the magnitude of the measured voltage will be displayed on display 40 along with information about the type of current and other aspects of the input signal. Other operating characteristics of the apparatus can also be displayed, such as an overload warning for measured voltages in excess of 999 volts, the condition of the battery or the like. A power supervision circuit 42 is adapted to provide stable supply voltages to the meter circuits, and also is designed to automatically shut the power off after a predetermined time or if battery power gets low.

Figure 3A:
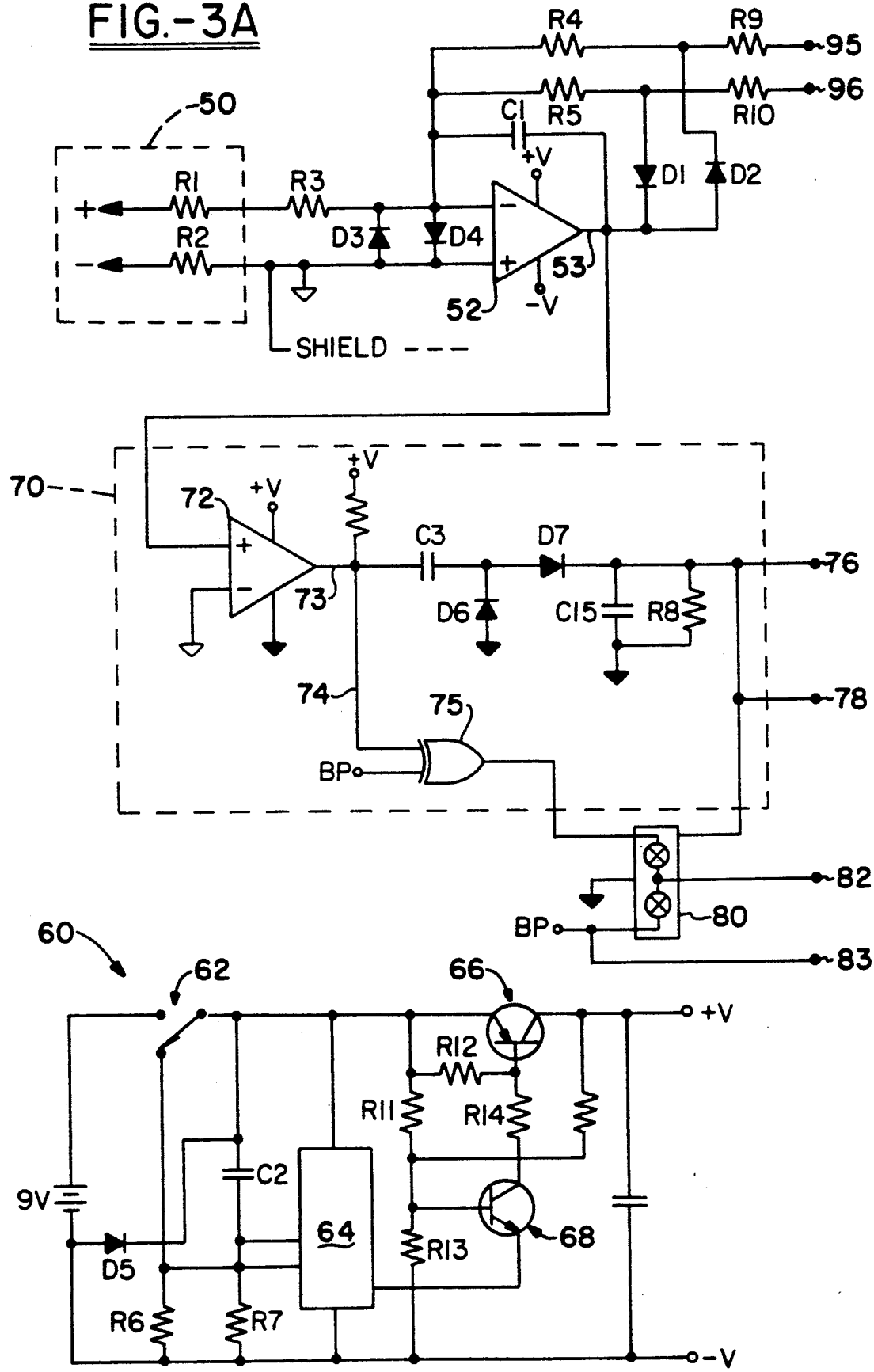
FIGS. 3a and 3b form a circuit diagram for the embodiment as shown in FIG. 2.
Figure 3B:
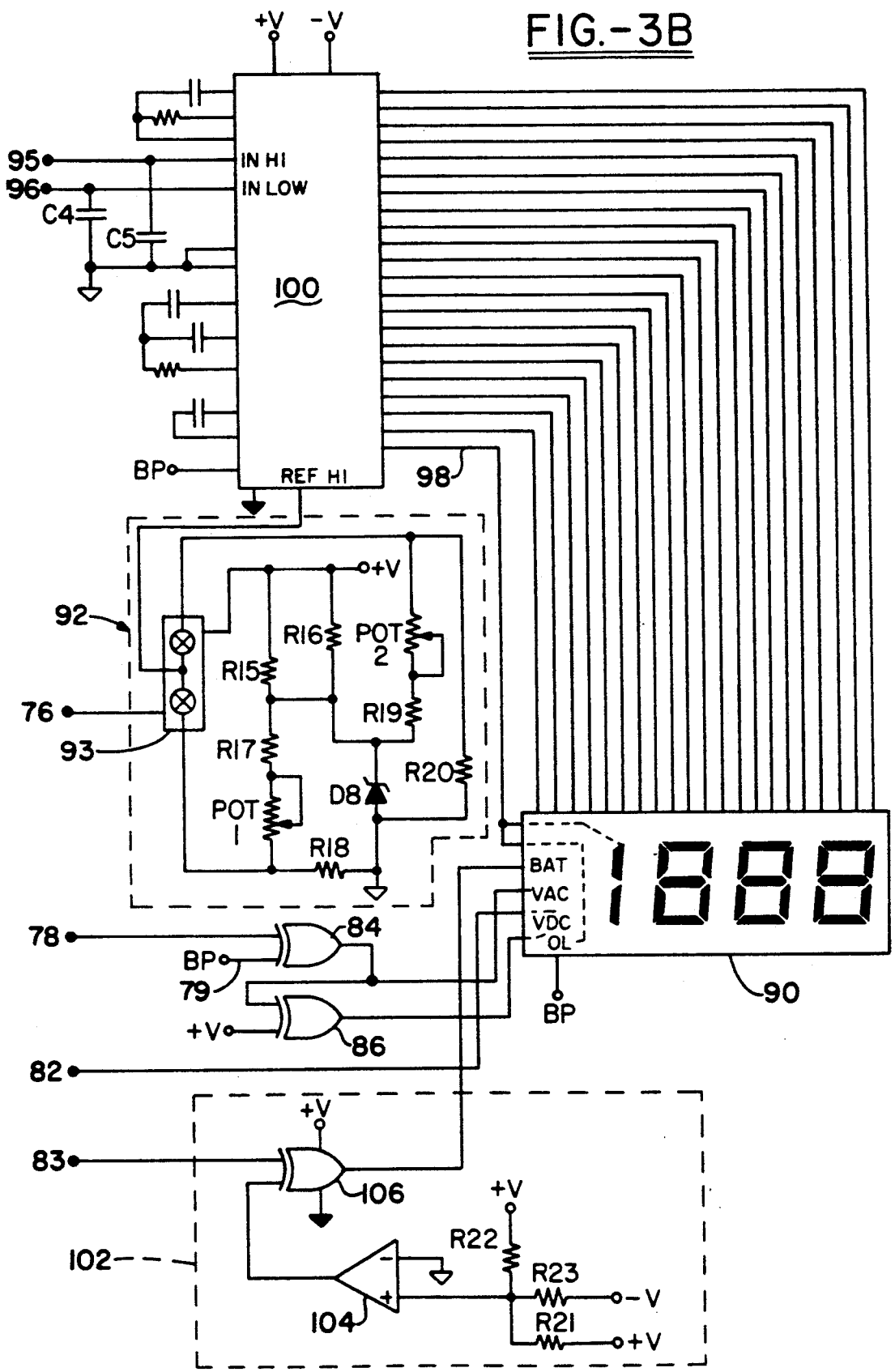

With reference to FIGS. 3a and 3b, the measuring circuit of this embodiment will be described in more detail. As seen in FIG. 3a, the measuring instrument is provided with external positive and negative probes 50 which include internal high voltage resistances R1 and R2. The high voltage resistances R1 and R2 act to protect the internal circuits of the voltmeter from voltage transients. An input voltage is connected to terminals 50 for measurement, and the input voltage is passed on to a signal conditioning circuit which may include another high voltage resistance R3 for additional protection. The input signal is then coupled to a conditioning operational amplifier 52 including feedback paths comprising current steering diode pairs D1, D2 and overload protection diodes D3, D4, resistors R4, R5 and capacitor C1. Upon receiving the input signal, the amplifier 52 generates a signal on line 53 which is coupled to the diode pair D1 and D2. If the input signal is a DC voltage, the output on line 53 will also be a DC voltage which includes an offset error voltage due to amplifier 52. Depending upon the polarity of the input voltage, one of the diodes D1 or D2 will turn on, and determine the feedback path for op amp 52. The op amp 52 will condition the input signal in association with filtering capacitor C1 to produce a output signal proportional to the magnitude of the input voltage which may be further processed. The diode pair D3 and D4 provide additional protection against voltage overloads to ensure safe use of the instrument.

As an example, if a positive voltage is input on the positive probe 50, with the other probe at ground potential, the diode D1 will turn on to define the feedback path of op amp 52. The output of op amp 52 on line 53 will comprise a voltage including a diode drop negative, which will turn on diode D1 so as to pull current through the feedback path including resistor R5. An output voltage will also be connected to resistor R10 on line 96, such that the output voltage on line 96 will be proportional to the magnitude of the input voltage, and additionally will include an offset voltage from op amp 52. As diode D2 will be turned off in this example, the output voltage through resistor R9 on line 95 will comprise the offset voltage induced by op amp 52. The offset voltage is a function of the supply voltages to op amp 52 from a power supervision circuit generally indicated at 60. In this way, the output signals on lines 95 and 96, representing DC voltages, will be conditioned properly for A-D conversion as will be hereinafter described. As seen in FIG. 3b, the output on lines 95 and 96 are connected to filtering capacitors C4 and C5, and inputs are then connected to an A-D converter 100 as signals "IN HI" and "IN LO". As previously mentioned, for a positive DC input voltage, the signal on line 96 will represent a signal proportional to the input voltage including an offset voltage, and line 95 represents the offset voltage. The IN HI and IN LO signals are measured differentially by the A-D converter 100, such that the offset voltage appearing in both signals will be canceled, and a voltage signal corresponding to the input voltage will be measured. It should be recognized that if the polarity of the input signal was reversed, the signal conditioning circuit would accomplish the same conditioning function, although the output signals on lines 95 and 95 would be reversed from that described.

Alternatively, for a AC input signal, the conditioning operational amplifier 52 in FIG. 3a will alternate its operation with each half cycle of the AC signal representing the positive and negative portions thereof. For each positive half cycle, the feedback path will include resistor R5, with the negative half cycles connected to the feedback path including resistance R4. In this manner, the output voltage on line 95 will be proportional to the negative half cycles of the AC input signal, while the output on line 96 will be proportional to the positive half cycles thereof. These output signals are again directed to filtering capacitors C4 and C5, to generate a DC voltage signal proportional to the portions of the AC input signal. These signals are connected to the "IN HI" and "IN LO" inputs of A-D converter 100. Each of these signals will represent an equal and opposite voltage signal proportional to the AC input voltage, and will include equal offset voltages associated therewith. Upon differential measurement of the input signals at A-D converter 100, the offset voltages will cancel and the inputs will be combined to yield an average voltage measurement of the AC input voltage. As will be hereinafter described, the AC input voltage measurement may be converted to an RMS measurement if desired. The A-D converter 100 is shown as a dedicated circuit element to develop output signals connected to a display 90, such as a liquid crystal display. It should be recognized that a microprocessor could be utilized which includes an A-D converter, to perform the A-D conversion along with other functions in the circuit.

Turning now to the power supervision circuit 60, the on/off switch 62 will supply power from the 9-volt battery supply to the timer 64 which is adapted to carry out a variety of functions. The power supervision circuit will automatically turn off the instrument after a predetermined elapsed time by means of timer 64. Upon switching switch 62 to the "on" position, the 9 volts from the battery supply will be connected across capacitor C2 and a parallel combination of resistors R6 and R7. This RC circuit generates a time constant which is input to timer 64. Diode D5 will be turned off upon switching the battery supply onto the RC circuit and across the parallel resistors R6 and R7. The resistors R6 and R7 will cause the input voltage supplied thereto to slowly exponential down to zero, with timer 64 continuously monitoring the input voltage supplied through the RC circuit. The timer 64 may be set with a predetermined voltage threshold, such that when the input voltage to timer 64 from the RC circuit reaches the threshold voltage, the timer 64 will generate an output to turn power off in the instrument. As shown in FIG. 3a, the parallel resistances R6 and R7 will determine the decay of the input signal to timer 64, and thus will determine the time-out period of the automatic power off function. As the shunt resistance provided by the resistors R6 and R7 determine the time-out period, they can be selected to provide any desired time-out period, or may be removed to eliminate the automatic time-out function. In this example, the time-out period may be set to approximately two minutes by providing resistor R6 as a 4.7 MΩ resistance, and resistor R7 as a 22 MΩ resistance. If resistor R7 is removed, a ten minute time out period will be realized.

The power supervision circuit 60 also performs a low battery shut-down function. The voltage from the battery supply will be connected across the voltage divider comprising resistors R11 and R13, to supply a predetermined voltage to the base of transistor 68. Transistor 68 has its collector connected to the base of transistor 66 through resistor R14. The emitter of transistor 68 is coupled to timer circuit 64. If the voltage from the battery supply is sufficient to turn-on transistor 66, this in turn will pull base current through transistor 66, thereby allowing the battery voltage to pass through to outputs of the power supervision circuit 60. In the time out function of the power supervision circuit 60, when a time-out is completed as previously described, an output signal is generated from timer 64 to the emitter of transistor 68, such that the emitter will go high to turn-off this transistor accordingly. Upon turning off transistor 68, transistor 66 will also be turned off, such that voltage from the battery supply will not be connected to the outputs of the power supervision circuit 60 so as to turn-off the instrument as desired. Similarly, if the voltage supplied by the battery is insufficient to turn on transistor 68, transistor 66 will also not be turned on and battery voltage will not pass to the outputs. The automatic low battery shut-down function will also depend upon the characteristics of transistor 68 and may be provided to automatically shut-down operation of the instrument or prevent operation if the battery voltage falls below 6.5 volts or the like. The automatic low battery shut-down function will eliminate possible measurement errors using the instrument if the battery supply is low. As will be hereinafter described, a low battery warning signal will be generated upon the voltage from the battery supply falling below a predetermined threshold value before automatic shut-down. The power supervision circuit 60 will otherwise produce stable positive and negative output reference voltages for use in other portions of the circuit.

The filtered and attenuated signal from the signal conditioning circuit is also coupled to the VAC/VDC control circuit generally indicated at 70. The VAC/VDC control circuit 70 comprises a comparator 72 which receives a non-rectified voltage signal as an input thereto. For example, a DC voltage input to the measuring circuit will have its polarity fixed at comparator 72, such that nothing will be coupled through capacitor C3 to the peak to peak rectifier comprising diodes D6 and D7. The output of the VAC/VDC control circuit 70 on line 76 and 78 will therefore be zero volts, which will indicate that a DC voltage is being measured. With reference to FIG. 3b, the output of the VAC/VDC control circuit 70 on line 76 is coupled to a switch 93 forming a part of a reference voltage generating circuit generally indicated at 92. The signal on line 76 will enable a proper reference voltage to be generated from circuit 92 and supplied to the A-D converter 100. Similarly, an output signal on line 78 is connected to a logic circuit to develop a display signal indicating the current type of voltage being measured. The comparator 72 will also act as a zero-cross detection comparator when an AC voltage is being measured. More specifically, when an AC input voltage is applied to the noninverting input of comparator 72, the output of comparator 72 will be coupled through capacitor C3 to the peak to peak rectifier comprising diodes D6 and D7. The peak to peak rectifier will rectify the negative portions of the AC voltage to produce a DC voltage corresponding to the magnitude of the AC input signal. The output of the peak to peak rectifier is then connected through a filtering RC circuit comprising capacitor C15 and resistor R8, to generate outputs on lines 76 and 78 representing a non-zero voltage signal indicating an AC input voltage.

In this manner, the VAC/VDC control circuit 70 will determine whether the voltage makes transitions through zero volts indicating an AC voltage. As previously mentioned, the output of circuit 70 will be applied to logic circuitry to provide a display of whether an AC voltage is present in the test circuit. The output signal of circuit 70 on lines 76 and 78 will therefore be high upon the detection of an AC voltage waveform. Alternatively, if no repeated transitions through zero volts are detected, the signal on lines 76 and 78 will be low accordingly. The output on line 76 is directed to a switch 93 and the signal on line 78 is directed to an exclusive-OR gate 84 as seen in FIG. 3b. As the signal from the circuit 70 will be at a high or low logic level depending upon whether an AC voltage is detected, the signal on line 78 coupled to the exclusive-OR gate 84 will vary accordingly. The other input to exclusive-OR gate 84 is a back plane signal supplied from A-D converter 100. A liquid crystal display 90 having a back plane and a back plane signal applied thereto may be provided with an AC volts annunciator, a DC volts annunciator as well as a polarity annunciator, each of which will be selectively activated according to the voltage detected. For example, if the VAC/VDC control circuit 70 supplies an output voltage which is at a high logic level, the output of the exclusive-OR gate 84 is in the inverted form compared to the back plane signal on line 79. Accordingly, the output of the exclusive-OR gate 84 will be out of phase with the back plane signal supplied thereto, and when applied to the AC annunciator will cause the annunciator to be activated for a display of AC volts as desired. Alternatively, if the output of detector 72 on line 73 is at a low logic level, the output of the exclusive-OR gate 84 will be in phase with the back plane signal and the VAC annunciator will be inactive. In this event, the output signal of the exclusive-OR gate 84 is coupled to another exclusive-OR gate 86, which also has as an input logic high. In this instance, the signal supplied to exclusive-OR gate 86 will be in phase with the back plane signal, which when supplied to the VDC liquid crystal annunciator will result in activation thereof.

The signal from the comparator 72 is also supplied on line 74 to another exclusive-OR gate 75. The exclusive-OR gate 75 also has the back plane signal supplied thereto, wherein it will be appreciated that whenever the output voltage of comparator 72 is at a high logic level, the output of exclusive-OR gate 75 will be out of phase with the back plane signal. The output of exclusive-OR gate 75 is supplied to a SPDT switch 80, which also has a back plane signal supplied thereto such that the output of switch 80 on line 82 will vary from an inverted signal or a signal which is in phase with the back plane signal supplied to liquid crystal display 90. If the output voltage of comparator 72 is of low logic level, this in turn will cause activation of the polarity annunciator associated with display 90 by means of the logic circuitry.

As mentioned previously, the outputs of the signal conditioning circuit are provided as scaled, attenuated and conditioned signals on lines 95 and 96. These outputs are supplied to A-D converter 100, and are filtered further by capacitors C4 and C5, to provide high and low inputs to A-D converter 100. A reference voltage is also supplied to the A-D converter 100 from circuit 92 so as to provide a proper reference voltage for AC or DC measurement. This will eliminate user selection of voltage type as desired. The circuit 92 comprises a SPDT switch 93 which has as an input thereto the voltage type signal from VAC/VDC control circuit 70 on line 76. The switch 93 also has as inputs, the appropriate reference voltages for either AC or DC voltage measurement. The reference voltage is developed within circuit 92 by a band gap diode D8 which is biased with a positive supply current through resistors R15 and R16. The band gap diode D8 produces a stable DC reference voltage, which in the preferred embodiment will be approximately 1.23 volts. This stable reference voltage is divided down through two voltage dividing networks, the first of which includes resistor R17, variable resistor or potentiometer POT1 and resistor R18. Another voltage divider comprises resistor R19, potentiometer POT2 and resistor R20. The reference voltages developed by these divider networks provide the proper reference voltages for both DC and AC input voltages according to the AC or DC decision signal supplied to switch 93 on line 76 from control circuit 70. The output of circuit 92 is then connected to the A-D converter 100, such that the differentially measured voltage between input high and low voltages on lines 95 and 96, will be properly referenced to develop proper display signals. The potentiometers POT1 and POT2 allow the reference voltage to be properly calibrated for either AC or DC voltages as desired. It also may be desired to indicate the presence of an overload voltage, wherein one of the outputs of A-D converter 100 may be associated with an overload annunciator on display 90 as indicated at 98. Upon the detected voltage exceeding a predetermined limit, such as 999 volts, the overload detector annunciator will be activated as desired.

A low battery indication may also be desired, provided by the circuit generally indicated at 102 in FIG. 3b. The circuit 102 will generally indicate when available battery power has dropped below a threshold limit. The battery voltage will be supplied from the power supervision circuit 60 as previously described, to the non-inverting input of a comparator 104. The comparator 104 will supply an output voltage to an exclusive-OR gate 106. The input voltage is supplied to the comparator 104 by means of scaling resistors R21, R22 and R23, for comparison with a predetermined threshold to yield an output voltage which is at a high logic level when the voltage is below the predetermined threshold. In this case, the output of the exclusive-OR gate 106, which is also supplied with the back plane signal on line 83, will be inverted or out of phase with the back plane signal, such that the battery annunciator associated with the liquid crystal display 90 will be activated by the output of exclusive-OR gate 106 as desired.

Figure 4:
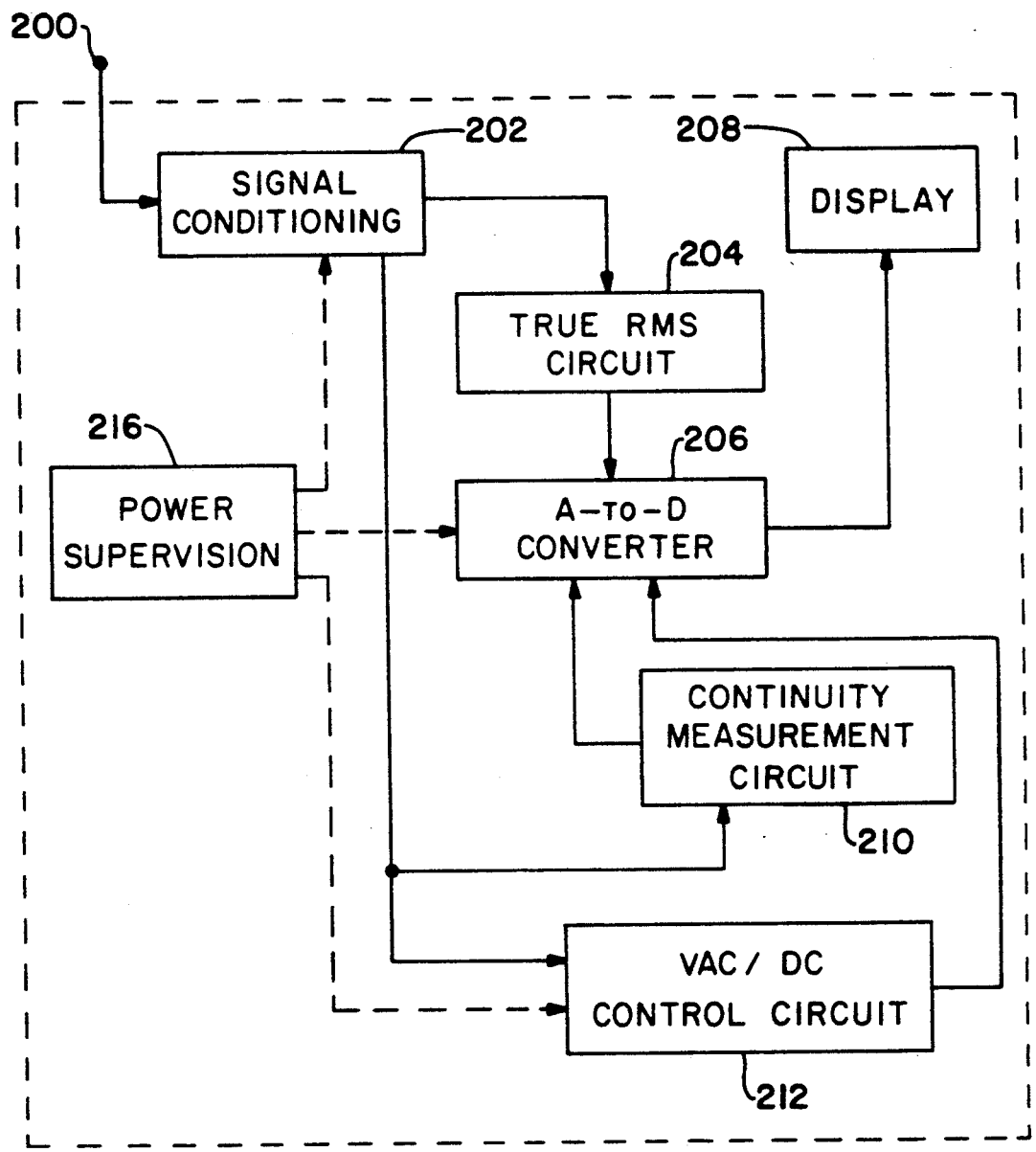
FIG. 4 shows a block diagram of an alternate embodiment of the voltage measuring apparatus of the invention.

Turning now to FIG. 4, there is generally illustrated in block form, a circuit diagram of an alternate embodiment of the measuring circuit associated with the voltage measuring apparatus of the invention. An input voltage will be connected through terminal 200, being the input probes of the voltmeter. A signal conditioning circuit 202 which is similar to that previously described, but which also includes additional circuitry is included. This signal conditioning circuit 202 again is adapted to provide protection against accidental overloads and processes the input signal to provide a scaled and attenuated signal which can be passed on for further processing within the instrument. The signal conditioning circuit 202 simulates a low impedance meter and allows the effects of distributed capacitance within a test circuit to be substantially eliminated. An output of the signal conditioning circuit 202 may be supplied to a circuit which will convert the root mean square (RMS) value of a complex AC voltage waveform to an equivalent DC voltage. In many instances, true RMS current measurements are not obtainable with conventional voltmeters. Non-linear loads being present within the tested circuit can distort sine waves, thereby causing inaccurate voltage readings or a reading not representing the RMS value. For example, solid state circuitry in electronic equipment may use only a portion of the AC voltage, such that a portion of the waveform is distorted or cut out. These are referred to as harmonic distortions, and are evident with such electronic equipment as computers, motor controllers and a variety of other equipment or environments in which the voltmeter is to be used. The true RMS converting circuit 204 provides a DC voltage output signal accurately representing the RMS value of an AC voltage supplied from signal conditioning circuit 202. The analog output of the true RMS circuit 204 is applied to an analog-to-digital converter 206 which derives a digital signal having a value commensurate with the value of the output of true RMS circuit 204. The digital output of the A-D converter 206 will then be supplied to the display 208, to indicate a voltage representing the RMS value of the AC signal at terminal 200.

An output from the signal conditioning circuitry 202 is also supplied to continuity measurement circuit 210. The continuity measurement circuit 210 will be automatically activated if the measured voltage lies between the predetermined low voltage range. Upon implementing the continuity function measurement circuit, a test current is introduced into the circuit being monitored to determine whether a condition of continuity or non-continuity exists. Upon pumping a current through the system, logic circuitry is adapted to compare the measured voltage before and after implementation of the continuity function, to provide an indication of continuity.

As further indicated in FIG. 4, the input signal is also supplied to the VAC/VDC control circuit 212 for automatically determining whether an AC or DC voltage is present. The A-D converter 206 will develop appropriate control signals for display 208 to display various operational characteristics of the voltmeter as well as the magnitude of AC or DC voltages measured. A power supervision circuit 216 may be provided to generate proper supply voltages to circuit components, as well as to automatically shut off operation of the voltmeter under certain circumstances as previously described.

A unique aspect of this embodiment of the invention is found in that it is substantially insensitive to the effects of distributed capacitance in residential or other wiring. For example, in meter installation applications, the digital voltmeter essentially functions similarly to an analog meter in that capacitance induced voltage readings are greatly attenuated. In the use of the voltmeter for checking the integrity of residential wiring, the wiring is normally checked by measuring the voltage between the line and load connections of a meter-base with the customers switch in the open position. The voltmeter of this embodiment is well suited to such an application due to its low sensitivity to distributed capacitance, allowing accurate voltage measurements to be obtained. As mentioned previously, the capacitance induced readings in conventional voltmeters are caused by a "parasitic" current which flows through the voltmeter and returns to ground via the distributed freespace and interconductor capacitance of the load wiring. The parasitic current flowing through the meter may result in ambiguous readings as to the condition of the load wiring. It is therefore desired to reject capacitance-coupled inputs to the voltmeter, to render the voltmeter substantially insensitive to the effects of distributed capacitance. The signal conditioning circuit 202 of this embodiment is adapted to divert the parasitic current introduced into the meter where significant capacitive effect is present, such that the parasitic current will not effect functioning of the metering circuit. Even though the signal conditioning circuit 202 is adapted to divert any parasitic current, if the voltmeter is used in the other applications, such as to verify service voltage, this circuitry will not introduce loading errors into the measurement. Although the voltmeter of this embodiment simulates a low impedance type meter, the instrument still includes safety features against possible overvoltages, melt down or explosions. The automatic selection of AC or DC measurement eliminates the potential hazard of a live circuit measuring zero due to incorrect meter-function selection by user. Further, the instrument generally provides a single range instrument to avoid the need for the user to select the proper voltage range.

Figure 5A:
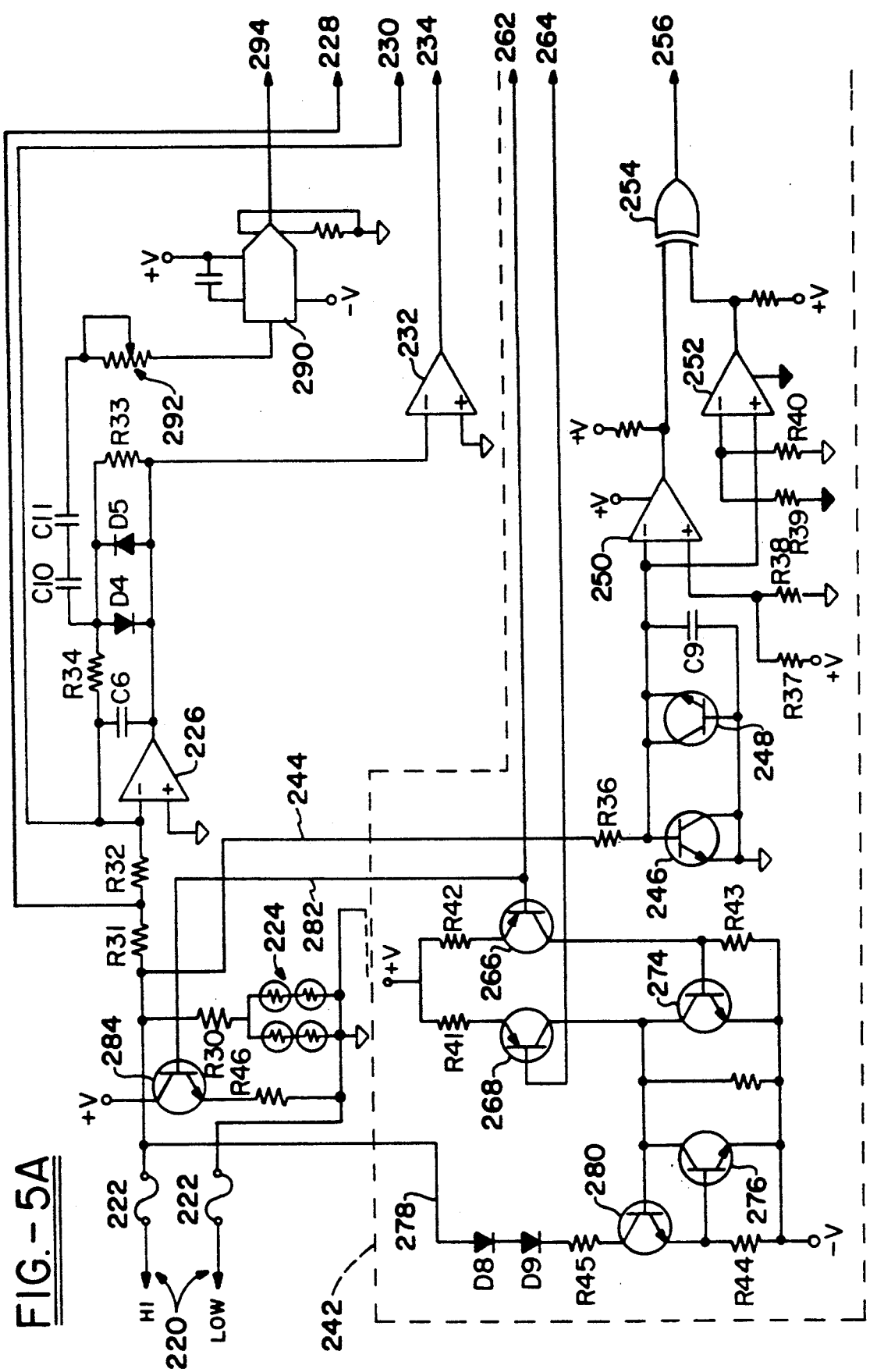
FIGS. 5a and 5b and form a circuit diagram for the embodiment of the invention as shown in FIG. 4.
Figure 5B:
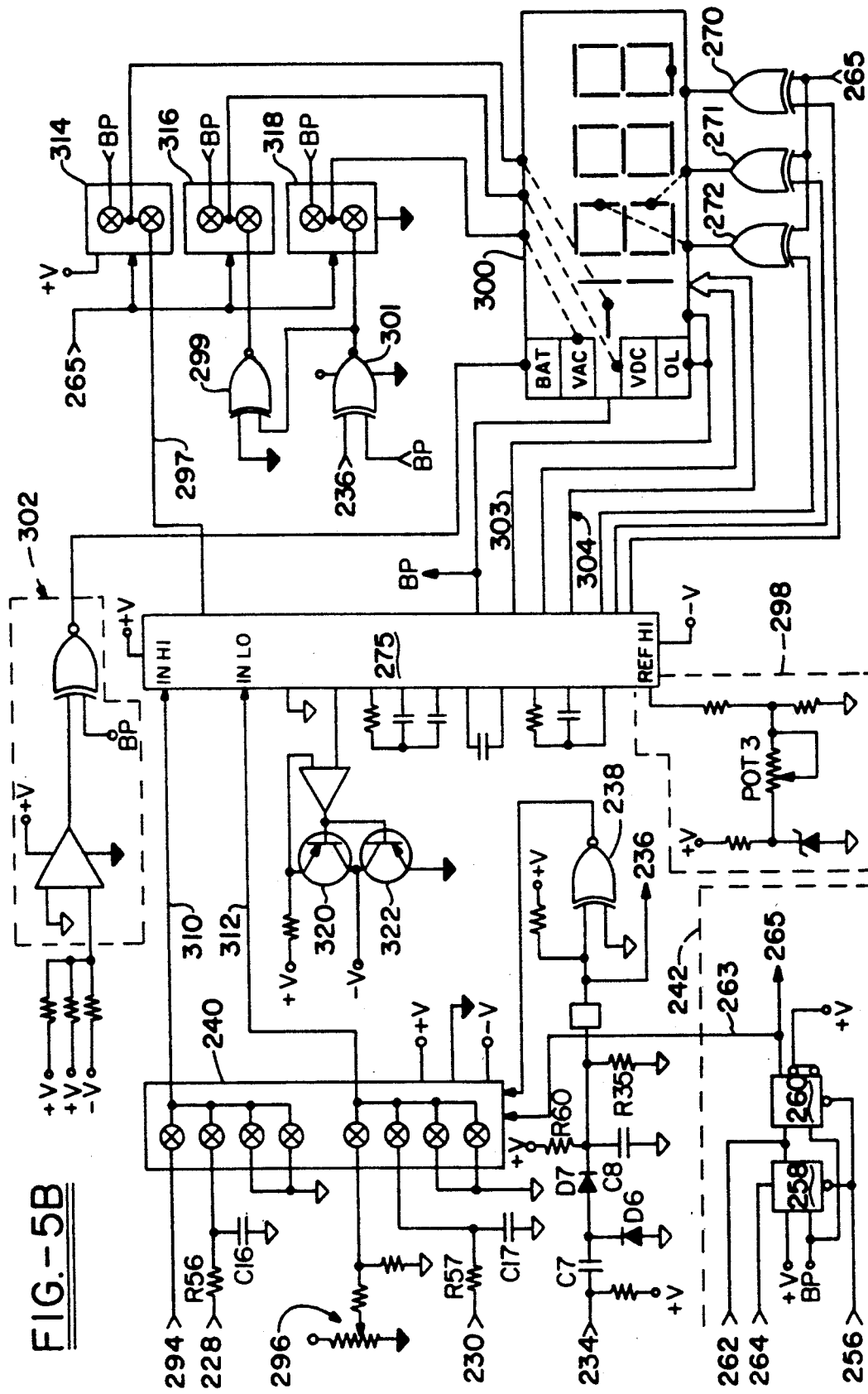

Turning now to FIGS. 5a and 5b, the measuring circuit of this embodiment of the invention will be described in more detail. As seen in FIG. 5a, the measuring instrument is provided with external positive and negative probes 220, which may include internal fuses 222 associated therewith. The internal fuses 222 will provide "backup" protection for the internal circuits of the measuring device. In this embodiment, the high-voltage resistors used in the test probes to protect against high-voltage transients have been eliminated and protection against high-voltage transients is now performed by power resistors R30 and R31 primarily, which are strapped across the input probes 222. A number of positive temperature coefficient (PTC) thermistors 224 are also provided in association with power resistors R30 and R31. As shown in FIG. 5a, two PTC thermistors are connected in series and are placed in parallel with another two series connected PTC thermistors. Although the positive temperature coefficient thermistors 224 are too slow to respond to voltage transients, they do provide added protection from longer term voltage overloads in association with the power resistors R30 and R31. The main purpose for the use of the thermistors 224 is to transform the voltmeter from a low resistance mode to a high resistance mode when making valid voltage measurements, for example when there are no distributed capacitance effects. The thermistors 224 provide increasing impedance as their temperature rises due to increased heating of power resistor R30. By providing the power resistor R30 in close association with the PTC thermistors 224, the heat developed by resistor R30 due to the input voltage will be transferred to the PTC thermistors 224 to provide a shunting resistance which will cause an open circuit if the thermistors 224 get too hot. By providing four thermistors in the arrangement as indicated in FIG. 5a, it is found that heat distribution to the thermistors from power resistor R30 is optimized, although it is recognized that other configurations are certainly possible. The signal conditioning circuitry provides over-voltage and transient protection, and produces a meter which simulates a low impedance type meter while enabling the transformation to a high impedance type meter when needed.

The protection afforded against high-voltage transients by means of the power resistors R30 and R31, allows the high impedance resistors within the probes of the measuring instrument to be eliminated. In this manner, the measuring instrument simulates a low impedance type meter to eliminate the effects of distributed capacitance. As mentioned previously, checking the integrity of residential wiring, or checking a standard meter base installation, requires various safety tests to be performed by the electric utilities meter installers or linemen for their protection as well as the customer's safety. These tests include a backfeed check on the load side of a meter base installation, wherein a voltage reading other than zero would indicate an abnormal condition. A line side voltage check is also normally performed to determine the system voltage limits. Other tests include a load side phase to neutral or ground fault check as well as a load side phase to phase fault check, wherein voltage readings other than zero would indicate a fault accordingly. In these situations, it is known that if a digital voltmeter is used, or where a long run of cable connects the meter and the customer's switch, capacitance effects may induce a voltage reading due to the capacitive reactance of the long cable run or the digital meter sensitivity. Although analog meters are relatively insensitive to distributive capacitance problems, basic sensitivity problems with analog meters make their use undesirable. On the other hand, high impedance voltmeters such as digital voltmeters, will normally be susceptible to distributive capacitance so as to yield ambiguous measurements.

In the present invention, the digital voltmeter simulates a low impedance type meter, and the power resistor R30 and PTC thermistors 224 provide a shunting impedance across the input terminals of the meter which diverts most of the parasitic current induced by distributed capacitance in the system. In this way, where a conventional digital voltmeter or digital multimeter will read between 50-90 volts due to distributed capacitance, the measuring instrument of the invention would indicate one volt or less, such that accurate voltage readings can still be made with the instrument.

In the metering circuit, the input voltage is connected to the inverting input of signal conditioning op-amp 226 through a voltage divider comprising resistances R31 and R32, which provide voltages on lines 228 and 230 to yield voltage signals indicative of a DC input voltage to the instrument. The voltage signal from the voltage divider node directly following resistance R31 along line 228 is coupled to a switch 240 after additional conditioning and filtering provided by resistor R56 and capacitor C16. Another voltage signal is extracted from the voltage divider after resistance R32, which is connected to switch 240 along line 230. This signal is also conditioned and filtered by resistance R57 and capacitor C17. These inputs to switch 240 will produce outputs on lines 310 and 312 to the IN HI and IN LO of the A-D converter 275. Both of the DC selection signals on lines 228 and 230 which are conditioned by the voltage divider comprising resistances R31 and R32 will include input offset voltages from the divider nodes. Upon differential measurement in the A-D converter 275, the DC IN HI and IN LO voltages will cancel the offset voltages associated therewith so as to be self correcting for an accurate indication of the voltage amplitude thereof. The resistors R31 and R32 are chosen so that a scale factor for A-D conversion is built into the DC selection signals on lines 228 and 230, such that when the differential voltage signal of input HI and input LO is measured against the reference HI signal within the A-D converter, an accurate output of voltage amplitude will be generated.

Alternatively, for an AC input signal, signal conditioning op-amp 226 will operate in conjunction with current steering diodes D4 and D5, and resistors R33 and R34 to provide a conditioned feedback signal in association with filtering capacitor C6. An output from the conditioning circuit is connected to DC blocking capacitors C10 and C11 to potentiometer 292, which acts to introduce a scaling factor into the positive and negative portions of the AC waveform. The conditioned output of the op-amp 226 is connected with a root mean square (RMS) converter 290 which develops an output on line 294, being a DC voltage proportional to the RMS voltage of the AC input voltage. The signal on line 294 is connected with switch 240, and will generate a signal on line 310 to the IN HI input of A-D converter 275. This signal is differentially measured with respect to a further signal developed by potentiometer 296 which is adjusted to null out any offset error introduced into the output of RMS converter 290 on line 294. This conditioned signal again includes a scaling factor, such that a single reference HI input from circuit 298 will allow accurate voltage amplitudes to be displayed regardless of the type or strength of the input voltage signal.

The filtered and attenuated signal from signal conditioning amplifier 226 is also coupled to a VAC/VDC control circuit similar to that described with reference to the previous embodiment. The VAC/VDC control circuit is adapted to automatically select proper AC or DC operation of the voltmeter as desired. Particularly, the output signal from signal conditioning amplifier 226 is coupled to the inverting input of comparator 232 which will generate an output on line 234 depending upon whether an AC or DC voltage is being measured. With reference to FIG. 5b, the output of comparator 232 is coupled in series with a capacitor C7 and a peak to peak rectifier comprising diodes D6 and D7. The signal is further level shifted and filtered by an RC circuit comprising capacitor C8 and resistors R35 and R60. The VAC/VDC control circuit will determine the current type, and develops an output signal along line 236 to a display device as will be hereinafter described. The output is also directed to an exclusive-OR gate 238, which as previously described will provide a logic output signal indicating whether the presence of an AC voltage has been detected which is supplied to a switch 240 to select the proper input signals to A-D converter 275.

The input signal from probes 22 is also connected to a continuity measurement circuit generally indicated at 242 as seen in FIG. 5a. The input voltage is coupled to the continuity circuit 242 on line 244 through a series resistor R36. Resistor R36 and transistors 246 and 248 provide overload protection in the circuit. The resistance R36 is coupled to the base of transistor 246, and a capacitor C9 is coupled to the collector of transistor 246 and base of transistor 248. The transistors 246 and 248 in conjunction with resistance R36 and capacitance C9 form a voltage clamping arrangement which will limit the voltage applied to the continuity measurement circuit 242. The output of the voltage clamp is then coupled to a window comparator comprising a first comparator 250 and a second comparator 252, each of which have reference input voltage set by resistances R37, R39 as well as R38, R40 respectively. In the preferred embodiment, the output of the voltage clamping transistors may be connected to the inverting input of comparator 250, which has as its input to its noninverting terminal a reference voltage of 300 mV. Similarly, the input voltage is coupled to the non-inverting input of comparator 252 while its inverting input is supplied with a reference voltage of $-300$ mV, so as to create a window in which the circuit 242 will be activated to perform a continuity measurement.

If the input voltage to the window comparator is between the preselected voltage references, such as a range between $+300$ mV to $-300$ mV, the outputs of the comparators 250 and 252 will be in phase, or at a high logic level for input to the exclusive-OR gate 254. The exclusive-OR gate 254 will in turn generate an output on line 256, which is supplied to further logic control circuits 258 and 260 as seen in FIG. 5b. The circuit elements 258 and 260 are shift registers, which in conjunction with the voltage clamping arrangement will monitor the input voltage and automatically effect a continuity measurement upon the occurrence of a voltage within the predetermined constrained range of the voltage clamping transistors. If the input voltage falls within the predetermined voltage range, the signal generated on line 256 is supplied to shift registers 258 and 260 to release the resets of each shift register. The shift register 258 also has as inputs a back plane signal which is a clock signal generated from the A-D converter 275. A positive supply voltage is also connected to a data line on shift register 258, such that upon release of the reset on register 258, it is now able to be set by the next leading edge of the clock signal provided as an input thereto. The register 258 will generate outputs on lines 262 and 264 representative of the level of the input voltage. Upon detecting a voltage within the predetermined voltage window, a logic high signal will be output on line 262 and a logic low signal on line 264. The outputs on lines 262 and 264 are connected to a current steering network comprising transistors 266 and 268. When shift register 258 clocks high, the signal on line 264 will turn on transistor 268, while the signal on line 262 will turn off transistor 266 so as to provide a current steering network.

In the current steering network, transistors 266 and 268 are biased by resistors R41 and R42 respectively, and have their emitters coupled to a positive supply voltage. In this manner, the current steering network provides turn on current to the base of transistor 280. The transistor 280 is a high compliance voltage current source which will provide a constant current for use in the continuity measurement. The current source also includes transistors 274 and 276 which act to regulate the current output of transistor 280. Operating current is supplied on line 278 through power diodes D8 and D9 and resistor R45 through the collector of transistor 280. Upon being turned on, the collector current of transistor 280 will approximately equal the emitter current biased by resistor R44. This current will turn on the base emitter of transistor 276 which will in turn deprive base current from transistor 280. This will regulate the output current of transistor 280 through transistors 274 and 266, such that the output of the continuity circuit 244 will be a constant current source regardless of the input voltage. For example, the output current of the continuity circuit 242 may be a 1 mA current which will be output on line 278. The transistor 284 will be turned on at the same time as transistor 280 so as to supply the 1 mA signal to the input LO to an external circuit being tested.

The constant current generated by continuity circuit 242 is pumped through an external test circuit to determine continuity within the external circuit. In the preferred embodiment, a 1 mA current is pumped through the external circuit and will be coupled back into the voltage measuring instrument through the HI probe if there is continuity within the external circuit. In this fashion, the voltage measured due to the current pumped through the test circuit by means of the continuity circuit 242 can be compared with the voltage measured initially within the voltage range of the window comparators 250 and 252. If excessive resistance or an open circuit condition exists between the HI and LO inputs to the instrument, no continuity would exist within the external circuit, and upon transistor 280 attempting to pull current from the node on the HI input, the input voltage would go negative outside the predetermined window of comparators 250 and 252. If continuity exists in the external circuit, the pumped current would come from positive supply voltage supplied through transistor 284 to input LO and through the external circuit to input HI and back through transistor 280. This signal will also be supplied to the voltage clamp and window comparator circuits. If the voltage signal generated from the pumped current is within the voltage window, the window comparator will generate a signal as previously described, such that the output of exclusive-OR gate 254 will indicate continuity in the external circuit.

If continuity is detected, the next edge of the clock signal provided as a back plane signal to shift register 260 will set this register to be turned on so as to generate output signals on lines 263 and 265. The output on line 263 acts to select the ground inputs for the IN HI and IN LO inputs supplied to the A-D converter 275. In this manner, regardless of what AC or DC voltage is input to the A-D converter 275 from the signal conditioning circuit, these inputs will be connected to ground so as to disable the output of the A-D converter 275 such that the display 300 will read 000. The output on line 265 from logic circuit 260 is supplied to exclusive-OR gates 270, 271 and 272, which also have signals generated from A-D converter 275 so as to turn on predetermined display annunciators for an indication of whether continuity is found in the tested circuit. The output on line 265 is also supplied to a series of switches 314, 316 and 318. Switch 314 is supplied with a signal from A-D converter 275 on line 297, and when continuity is found, the output from switch 314 will disable the polarity annunciator on display 300. The switches 316 and 318 are also supplied with inputs from exclusive-OR gates 299 and 301 respectively. Exclusive-OR gate 301 has as an input on line 236, and indication from the VAC/VDC control circuit of whether an AC or DC voltage is present as previously described. If an AC voltage is present, the output of exclusive-OR gate 301 will operate to turn on the VAC annunciator. If continuity exists, the input on line 265 will disable this output as desired. Similarly, exclusive-OR gate 299 will generate a signal to turn on the VDC annunciator if a DC voltage is present, but will be disabled by the signal on line 265 if continuity exists. If no continuity exists, and the input voltage is below one volt, an indication of zero volts will be displayed on display 300.

As mentioned previously, the measuring circuit of this embodiment also includes a true RMS measuring circuit comprising an RMS-to-DC converter 290 which has the input voltage signal connected therewith through signal conditioning amplifier stage 226. An AC signal is directed to converter 290 through DC blocking capacitors C10 and C11 and an AC gain potentiometer 292. The output of the RMS converter 290 on line 294 is connected with switch 240 as seen in FIG. 5b. As previously mentioned, the VAC/VDC control circuit will also generate a signal from exclusive-OR gate 238 to switch 240, which will control the switch to discriminate either AC or DC components of the signals supplied thereto on lines 228 and 230 as well as from RMS converter 290 on line 294. If an AC signal is present, the signals from RMS converter 290 will be supplied to switch 240 as input HI with input LO supplied from potentiometer 296. The output of potentiometer 296 is adjusted to null out the offset DC error generated from RMS converter 290. If a DC voltage is present, the signals from the signal conditioning circuit on lines 228 and 230 are supplied to switch 240 through filtering networks as previously described. Any input offsets introduced from the divider nodes in the signal conditioning circuit will be self-correcting upon differential measurement of the DC signals provided from divider nodes on lines 228 and 230.

The A-D converter 275 will generate voltage magnitude output control signals on lines 304 in addition to those already mentioned to yield the proper display on liquid crystal display 300. A low battery monitoring circuit generally indicated at 302, will generate an appropriate output signal to activate a low battery annunciator on display 300 when the power supply voltage falls below a predetermined level as previously described. An overload signal is also generated from A-D converter 275 on line 303 to activate the overload annunciator upon measuring a voltage above a predetermined level, such as 999 volts. A power supervision circuit similar to that described with reference to the embodiment of FIGS. 3a and 3b may also utilized in conjunction with the embodiment of FIGS. 5a and 5b to generate proper supply voltages for the circuit components as well as performing the automatic shut off functions. The meter may be automatically turned off when available battery power falls below a predetermined limit, or after a predetermined amount of time has elapsed as previously indicated. A voltage reference signal is supplied to the A-D converter 275 by means of circuit 298 as seen in FIG. 5. This circuit will generate a reference voltage against which the input voltage is ratioed and scaled. In this embodiment, only one potentiometer POT3 is needed, as scaling of the input voltages is achieved within the signal conditioning circuits of the instrument. The proper scale factors for conversion in the A-D converter 275 may be provided within the voltage divider for DC conditioning, or as appropriate resistances in the RMS converter configuration to effect the proper scale factors.

The voltage measuring instrument of the invention provides automatic selection of AC or DC voltages with a proper reference signal generated to avoid possible safety hazards associated with user selection of these parameters. The instrument provides protection against voltage transients and conditions input signals for digital conversion. The instrument is especially advantageous in the measurement of voltages where parasitic capacitance effects exist, as any stray capacitance within a measured circuit will be diverted so as not to effect proper measurement of the voltage in the circuit. A continuity measurement may be automatically performed under low voltage conditions, and true RMS AC voltage measurements may be provided. The power supervision circuit provides automatic shutoff capabilities to insure accurate measurements and facilitate use of the apparatus. While there have been described and illustrated herein several specific embodiments of the invention, it will be apparent that variations in the details of the embodiments may be made without departing from the true spirit and scope of the invention as defined in the appended claims.

We claim:

1. A digital voltage measuring instrument for providing a display of the magnitude of an analog voltage signal, comprising:
   input terminal means for operatively connecting an input analog voltage to be measured to a metering circuit,
   said metering circuit comprising a signal conditioning circuit having impedance means to attenuate voltage transients and overloads for protection of the metering circuit and gain adjust said input voltage,
   a VAC/VDC control circuit connected to said signal conditioning circuit for automatically detecting whether said input voltage is an AC or DC voltage, and generating control signals indicating the current-type of the input voltage as well as controlling the measurement of said voltage, said control circuit having a zero-cross detecting means including a comparator to which said input voltage is supplied and a peak to peak rectifier coupled to said comparator,
   an A/D converter having inputs from said signal conditioning circuit and said VAC/VDC control circuit supplied thereto so as to generate digital output signals indicative of the magnitude of said input voltage,
   the A/D converter of said metering circuit being operatively connected to a display means to receive said digital output signals and visually display them in a readable form.

2. The voltage measuring instrument of claim 1, wherein;
   said input terminal means comprises input probes including high impedance resistors in association therewith, to protect said metering circuit from voltage transients.

3. The voltage measuring instrument of claim 2, wherein,
   said input probes include a positive probe, and said impedance means of said signal conditioning circuit comprises a high impedance resistance placed in series with the high impedance resistor associated with said positive probe.

4. The voltage measuring instrument of claim 1, wherein,
   said input terminal means comprises positive and negative input terminal probes, and said impedance means of said signal conditioning circuit includes a high impedance resistance placed in series with said positive input terminal probe.

5. The voltage measuring instrument of claim 1, wherein,
   said signal conditioning circuit further includes a low impedance path comprising a power resistor connected in series with at least one positive temperature coefficient thermistor, being strapped across said input terminal means so as to connect any voltage transients occurring on said input terminal means through said power resistor to cause heating thereof, which will in turn cause the impedance of said at least one positive temperature coefficient thermistor to be increased dependent upon the amount of heating of said power resistor.

6. The voltage measuring instrument of claim 5, wherein,
   said power resistor is placed in series with two pair of series connected positive temperature coefficient thermistors which are connected in parallel with one another.

7. The voltage measuring instrument of claim 1, wherein,
   said control signals generated by said VAC/VDC control circuit comprise a signal connected to said A/D converter to set said metering circuit to measure an AC or DC voltage applied across said input terminal means, a signal connected to said display means to display the current type of voltage being measured and a polarity signal connected to said display means to indicate the polarity of the measured voltage.

8. The voltage measuring instrument of claim 1, wherein,
   said metering circuit further comprises a power supervision circuit which includes a counter means adapted to automatically switch off power to the metering circuit after a predetermined amount of time has elapsed after switching power from the battery power source to the metering circuit.

9. The voltage measuring instrument of claim 1, wherein
   said metering circuit further comprises a power supervision circuit which includes a battery power supply and a comparator supplied with a voltage from said battery power supply indicative of the available battery power and adapted to automatically switch off power to the metering circuit if the battery power falls below a predetermined level.

10. The voltage measuring instrument of claim 1, further comprising,
    a true RMS measuring circuit comprising a RMS to DC converter which is supplied with an input signal from said signal conditioning circuit representative of the AC waveform signal, and generating a DC output signal representative of the RMS value of said AC waveform signal which is supplied to said A/D converter to generate digital output signals indicative of the RMS value of said input voltage.

11. The voltage measuring instrument of claim 1, further comprising,
    a continuity measuring circuit including a window comparator which is supplied with an input voltage from an external circuit through said input terminal means, wherein said window comparator will determined if the input voltage is within a predetermined range which will activate the continuity measurement function, wherein upon activation of said continuity measurement function, a current will be generated and connected to said external circuit through said input terminal means such that if continuity exists in said external circuit, said generated current will produce an input voltage signal to said metering circuit so as to yield an indication of whether continuity exists in said external circuit.

12. The voltage measuring instrument of claim 11, wherein,
said continuity measuring circuit further comprises a voltage clamp acting to limit the voltage input to said window comparator, and includes means to generate an output signal activating said continuity measurement circuit and disabling outputs from said signal conditioning circuit and said VAC/VDC control circuit supplied to said A/D converter, such that an indication relating to said continuity measurement will be displayed on said display means.

13. The voltage measuring instrument of claim 11, wherein,
said continuity measuring circuit extracts a current from said input voltage which is connected to a high voltage network including series connected high voltage diodes and a transistor forming a constant current source which generates the current supplied to the test circuit.

14. The voltage measuring instrument of claim 11, wherein,
said continuity measurement circuit further includes comparing means for comparing the voltage measured by the metering circuit initially and the voltage measured upon introducing the current from the continuity measurement circuit to said external circuit, to determined whether a voltage drop has occurred which would indicate non-continuity in said external circuit.

15. The voltage measuring instrument of claim 1, wherein,
said signal conditioning circuit includes a shunting impedance means connected across the input terminal means to divert electric currents coupled to the measuring instrument, which have been induced in an external circuit under test by distributed capacitance effects of said external test circuit.

16. The voltage measuring instrument of claim 15, wherein,
said shunting impedance means comprises a power resistor connected in series with at least one positive temperature coefficient thermistor, said power resistor and at least one thermistor being strapped across said input terminal means and acting to divert said elective currents.

17. The voltage measuring instrument of claim 16, wherein,
said power resistor is placed in series with two pair of series connected positive temperature coefficient thermistors which are connected in parallel with one another.

18. The voltage measuring instrument of claim 1, wherein,
said signal conditioning circuit further includes a low impedance path comprising at least one positive temperature coefficient thermistor strapped across said input terminal means.

19. The voltage measuring instrument of claim 1, wherein,
said control signals generated by said VAC/VDC control circuit include a signal coupled to a switch means to discriminate either AC or DC components of the signals supplied to said switch means from said signal conditioning circuit, wherein said switch means thereafter couples the said AC or DC components to said A to D converter.

* * * * *